(12) United States Patent
Kuwazawa et al.

(10) Patent No.: US 10,541,299 B2
(45) Date of Patent: Jan. 21, 2020

(54) SEMICONDUCTOR DEVICE AND MANUFACTURING METHOD THEREOF

(71) Applicant: SEIKO EPSON CORPORATION, Tokyo (JP)

(72) Inventors: Kazunobu Kuwazawa, Sakata (JP); Shigeyuki Sakuma, Sakata (JP); Hiroaki Nitta, Sakata (JP); Mitsuo Sekisawa, Sakata (JP); Takehiro Endo, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 3 days.

(21) Appl. No.: 15/365,738

(22) Filed: Nov. 30, 2016

(65) Prior Publication Data
US 2017/0170262 A1 Jun. 15, 2017

(30) Foreign Application Priority Data
Dec. 11, 2015 (JP) .................................. 2015-242057

(51) Int. Cl.
| | | |
|---|---|---|
| *H01L 27/082* | (2006.01) | |
| *H01L 29/06* | (2006.01) | |
| *H01L 29/10* | (2006.01) | |
| *H01L 29/732* | (2006.01) | |
| *H01L 29/78* | (2006.01) | |

(52) U.S. Cl.
CPC ...... *H01L 29/0615* (2013.01); *H01L 29/1095* (2013.01); *H01L 29/732* (2013.01); *H01L 29/7816* (2013.01)

(58) Field of Classification Search
CPC .................... H01L 27/0821; H01L 29/0692
See application file for complete search history.

(56) References Cited

U.S. PATENT DOCUMENTS

| | | | |
|---|---|---|---|
| 4,979,001 A | | 12/1990 | Alter |
| 5,565,701 A | * | 10/1996 | Zambrano ........... H01L 27/0821 257/500 |

(Continued)

FOREIGN PATENT DOCUMENTS

| | | |
|---|---|---|
| JP | S59-22363 A | 2/1984 |
| JP | H02-071555 A | 3/1990 |

(Continued)

*Primary Examiner* — Moazzam Hossain
*Assistant Examiner* — Hajar Kolahdouzan
(74) *Attorney, Agent, or Firm* — Oliff PLC

(57) ABSTRACT

A semiconductor device includes a first conductivity type semiconductor substrate, a second conductivity type first and second buried diffusion layers that are arranged in the semiconductor substrate, a semiconductor layer arranged on the semiconductor substrate, a second conductivity type first impurity diffusion region that is arranged in the semiconductor layer, a second conductivity type second impurity diffusion region that is arranged, in the semiconductor layer, on the second buried diffusion layer, a second conductivity type first well that is arranged in a first region of the semiconductor layer, a first conductivity type second well that is arranged, in the semiconductor layer, in a second region, a first conductivity type third and fourth impurity diffusion regions that are arranged in the first well, and a first conductivity type fifth impurity diffusion region that is arranged in the second well.

8 Claims, 12 Drawing Sheets

(56) References Cited

U.S. PATENT DOCUMENTS

| | | |
|---|---|---|
| 2004/0251517 A1 | 12/2004 | Nakashima |
| 2005/0087771 A1* | 4/2005 | Kanda ................. H01L 27/0647 257/213 |
| 2015/0123237 A1 | 5/2015 | Sakuma |

FOREIGN PATENT DOCUMENTS

| | | |
|---|---|---|
| JP | H03-44962 A | 2/1991 |
| JP | H10-144811 A | 5/1998 |
| JP | H11-163373 A | 6/1999 |
| JP | 2005-005446 A | 1/2005 |
| JP | 2006-165370 A | 6/2006 |
| JP | 2015-090913 A | 5/2015 |

\* cited by examiner

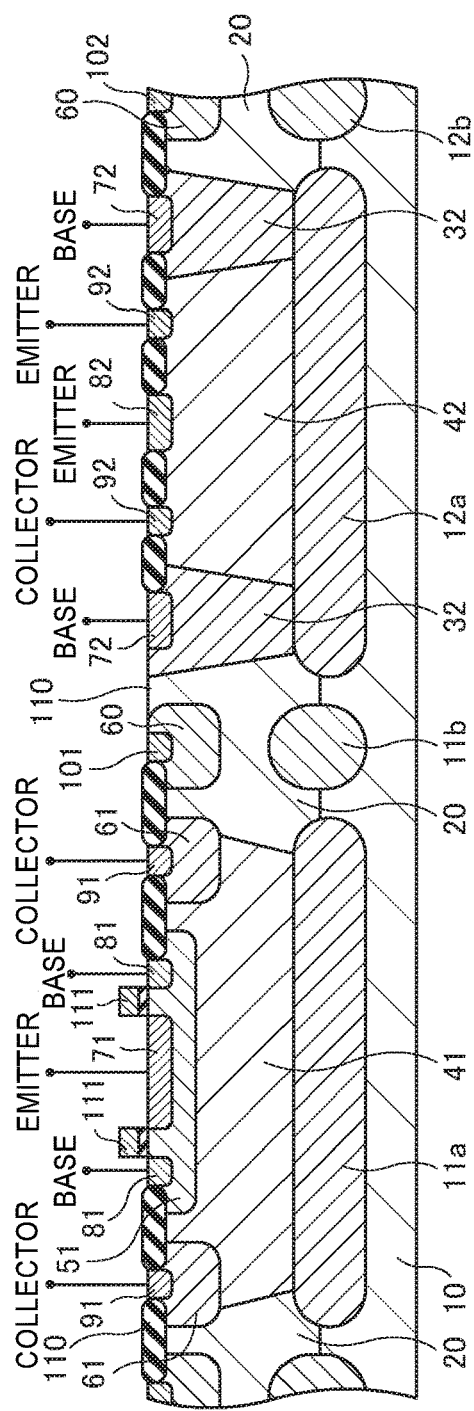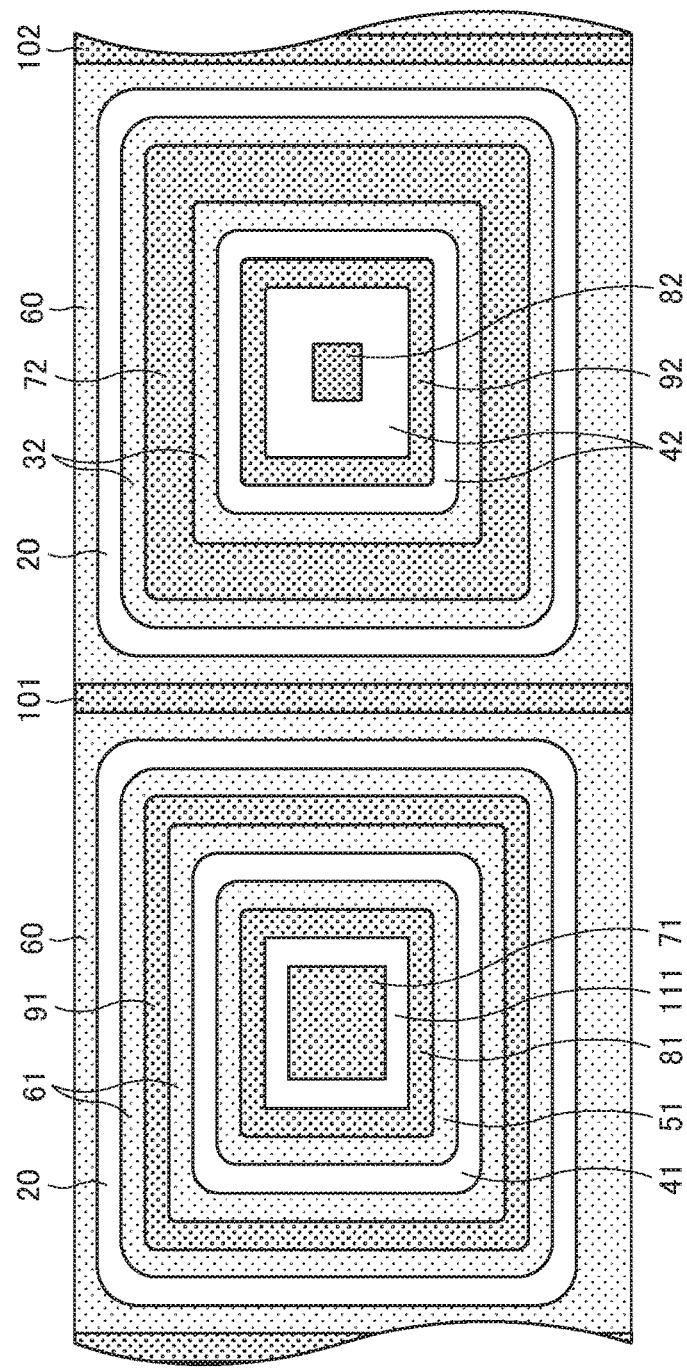

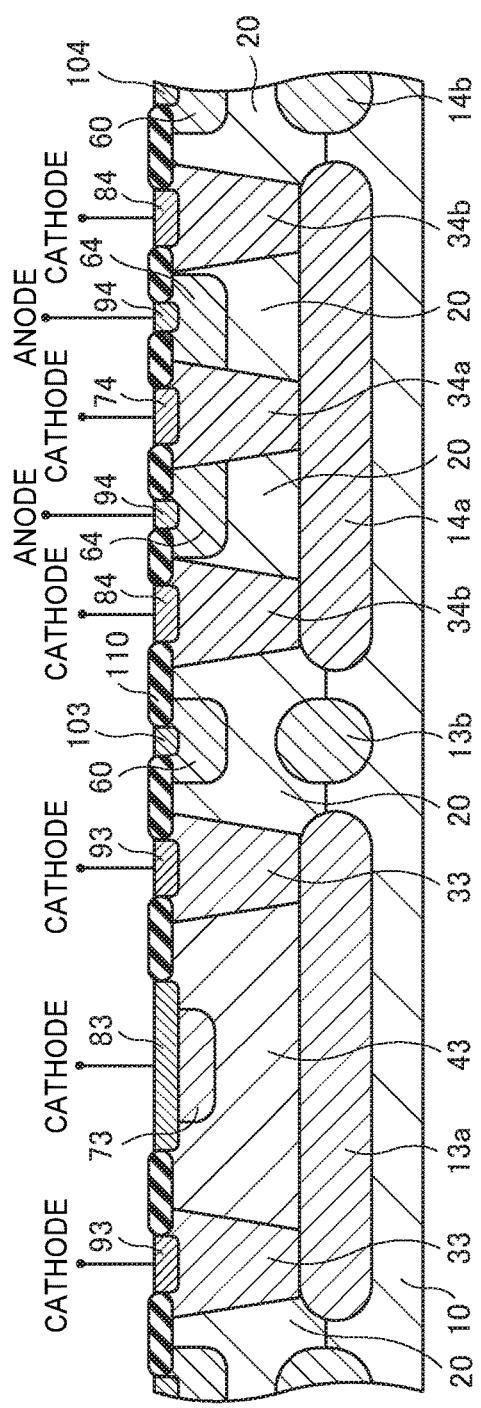
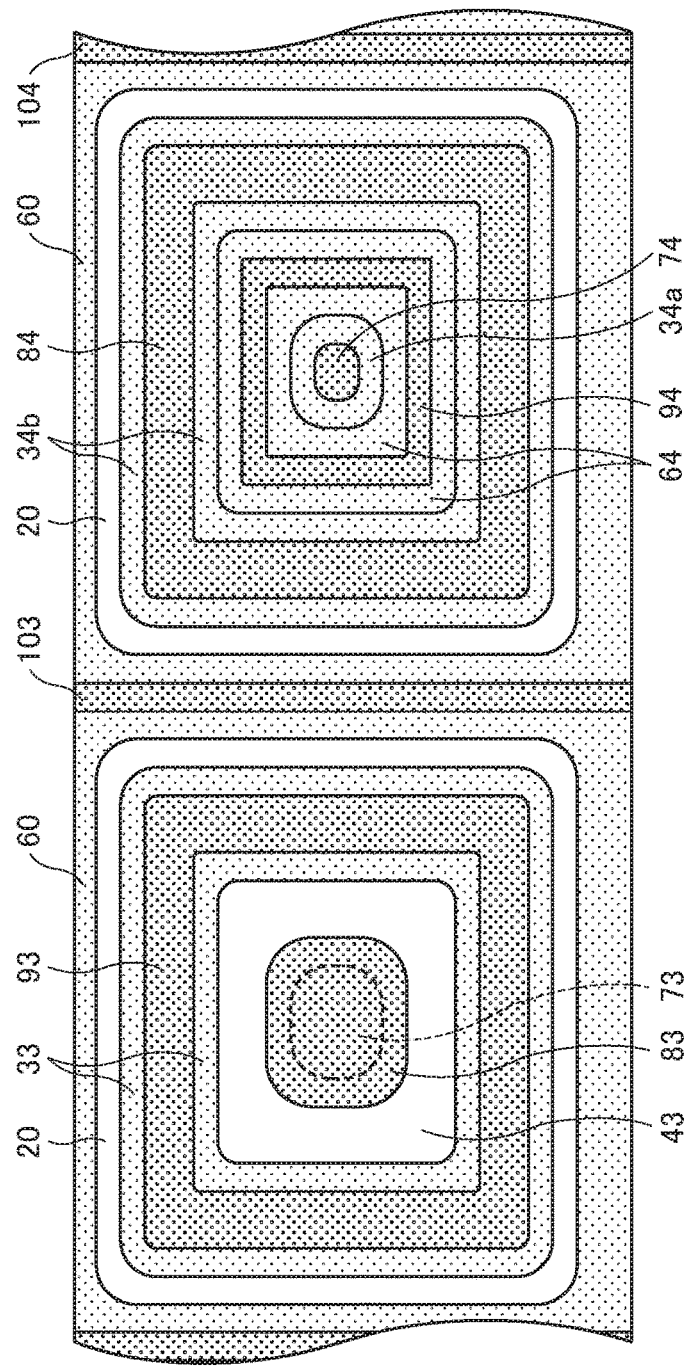
FIG. 2A
FIG. 2B

SEMICONDUCTOR DEVICE AND MANUFACTURING METHOD THEREOF

BACKGROUND

1. Technical Field

The present invention relates to a semiconductor device, a manufacturing method of the semiconductor device, and the like.

2. Related Art

A semiconductor device that includes a lateral PNP bipolar transistor is used as a circuit element, for example. The transistor includes an N-type buried diffusion layer arranged in a P-type semiconductor substrate, a P-type epitaxial layer (semiconductor layer) arranged on the semiconductor substrate, an N-type impurity diffusion region (N-plug) that extends from a surface of the semiconductor layer to the buried diffusion layer to have a contact with the buried diffusion layer, and a deep N-well that reaches the buried diffusion layer.

In a manufacturing process of such a semiconductor device, forming the N-type buried diffusion layer under the P-type semiconductor layer, forming the N-plug that extends from the surface of the semiconductor layer to the buried diffusion layer, and forming a deep N-well that reaches the buried diffusion layer, which are not used in forming a MOS field effect transistor, are needed.

Also, there are cases in which a zener diode is formed as a circuit element in a semiconductor device. The zener diode is constituted by a PN junction of a high concentration P-type impurity diffusion region and an N-type impurity diffusion region. In general, the PN junction is formed by joining a P-type impurity diffusion region that constitutes a source or a drain of a MOS field effect transistor and an N-type impurity diffusion region. Note that forming the PN junction by adding another impurity diffusion region having a different concentration and adjusting the concentration thereof is needed when the specifications of the breakdown voltage are different.

Furthermore, there are cases in which an LD (Lateral Double-diffused) MOS field effect transistor is formed as a circuit element in a semiconductor device. In this case, forming an N-type buried diffusion layer under a P-type semiconductor layer, forming a deep N-well that reaches the buried diffusion layer, and forming a body region in a portion of the deep N-well, which are not used in forming a MOS field effect transistor, are needed.

A semiconductor device including a diode in which breakdown voltage fluctuation is suppressed is disclosed in FIGS. 1 and 2 of JP-A-2015-90913 (paragraphs 0008-0009, FIGS. 1 and 2), as a related technology. The semiconductor device includes a P-type epitaxial growth layer 13 provided above a silicon substrate 11 via an N-type buried layer 12, an element isolation region 17, 18 formed in the epitaxial growth layer 13, an $N^-$-type cathode 14 that is formed in the epitaxial growth layer 13 and located inside the element isolation region 17, 18, and a $P^-$-type anode 20 that is formed above the cathode 14 so as to be in contact therewith and covers an inner corner portion of the element isolation region 17, 18.

Incidentally, it is required that, in addition to the aforementioned lateral bipolar transistor, other types of circuit elements or a zener diode having a desired breakdown voltage are mounted together in the semiconductor device, in order to realize various circuits. Meanwhile, when an attempt is made to mount a plurality of different types of circuit elements together in the semiconductor device, processes for forming dedicated impurity diffusion regions for respective circuit elements increase, and the manufacturing cost of the semiconductor device increases due to the increased number of masks and processes.

SUMMARY

Some aspects of the invention relate to a method of providing a semiconductor device in which a plurality of different types of circuit elements are mounted together in order to realize various circuits. Also, some aspects of the invention relate to a method of manufacturing a semiconductor device in which a plurality of different types of circuit elements are mounted together without significantly increasing the manufacturing processes.

A semiconductor device according to a first aspect of the invention includes: a first conductivity type semiconductor substrate; a second conductivity type first buried diffusion layer and a second conductivity type second buried diffusion layer that are arranged in the semiconductor substrate; a semiconductor layer arranged on the semiconductor substrate; a second conductivity type first impurity diffusion region that is arranged in the semiconductor layer and surrounds a first region of the semiconductor layer on the first buried diffusion layer in plan view; a second conductivity type second impurity diffusion region that is arranged, in the semiconductor layer, on the second buried diffusion layer; a second conductivity type first well that is arranged in the first region of the semiconductor layer; a first conductivity type second well that is arranged, in the semiconductor layer, in a second region that is in contact with the second impurity diffusion region; a first conductivity type third impurity diffusion region and a first conductivity type fourth impurity diffusion region that are arranged in the first well; and a first conductivity type fifth impurity diffusion region that is arranged in the second well. Note that, in the application, the first conductivity type may be P type and the second conductivity type may be N type, or the first conductivity type may be N type and the second conductivity type may be P type.

According to the semiconductor device according to the first aspect of the invention, a lateral bipolar transistor can be configured in which the first impurity diffusion region or the like is a base region, and the third impurity diffusion region and the fourth impurity diffusion region are respectively an emitter region and a collector region. Also, a lateral zener diode can be configured in which the second impurity diffusion region or the like is a cathode region or an anode region, and the fifth impurity diffusion region is an anode region or a cathode region.

In this way, according to the semiconductor device according to the first aspect of the invention, a plurality of different types of circuit elements are mounted together in the same semiconductor device and various circuits can be realized using the common basic structure that is constituted by the buried diffusion layer arranged in the semiconductor substrate, and the impurity diffusion region that is arranged, in the semiconductor layer, on the buried diffusion layer.

A semiconductor device according to a second aspect of the invention includes, in addition to the aforementioned aspect, a second conductivity type third buried diffusion layer that is arranged in the semiconductor substrate; a second conductivity type sixth impurity diffusion region that is arranged in the semiconductor layer and surrounds a third region of the semiconductor layer on the third buried diffusion layer in plan view; a second conductivity type third well that is arranged in the third region of the semiconductor layer; a second conductivity type seventh impurity diffusion region that is arranged in the third well; and a first conductivity type eighth impurity diffusion region that is arranged at least on the seventh impurity diffusion region.

According to the semiconductor device according to the second aspect of the invention, a vertical zener diode can be configured in which the sixth and seventh impurity diffusion regions or the like are a cathode region or an anode region, and the eighth impurity diffusion region is an anode region or a cathode region.

A semiconductor device according to a third aspect of the invention includes, in addition to the aforementioned embodiments, a second conductivity type fourth buried diffusion layer that is arranged in the semiconductor substrate; a second conductivity type fourth well that is arranged in a fourth region of the semiconductor layer on the fourth buried diffusion layer; a first conductivity type ninth impurity diffusion region that is arranged in the fourth well; a second conductivity type tenth impurity diffusion region that is arranged in the fourth well; a gate electrode that is arranged above the fourth well via an insulating film; and a second conductivity type eleventh impurity diffusion region that is arranged in the ninth impurity diffusion region.

According to the semiconductor device according to the third aspect of the invention, an LDMOS field effect transistor can be configured in which the ninth impurity diffusion region is a body region, the tenth impurity diffusion region is a drift region or a drain region, and the eleventh impurity diffusion region is a source region.

In this way, according to the semiconductor device according to the second or third aspect, a plurality of different types of circuit elements are mounted together in the same semiconductor device and various circuits can be realized using the common basic structure that is constituted by the buried diffusion layer arranged in the semiconductor substrate, and the impurity diffusion region or the well that is arranged, in the semiconductor layer, on the buried diffusion layer.

A manufacturing method of a semiconductor device according to the first aspect of the invention includes forming a second conductivity type first buried diffusion layer and a second conductivity type second buried diffusion layer simultaneously in a first conductivity type semiconductor substrate; forming a semiconductor layer on the semiconductor substrate; forming a second conductivity type first impurity diffusion region, in the semiconductor layer, that surrounds a first region of the semiconductor layer on the first buried diffusion layer in plan view, and simultaneously, forming, in the semiconductor layer, a second conductivity type second impurity diffusion region on the second buried diffusion layer; forming a second conductivity type first well in the first region of the semiconductor layer; forming, in the semiconductor layer, a first conductivity type second well in a second region that is in contact with the second impurity diffusion region; and forming a first conductivity type third impurity diffusion region and a first conductivity type fourth impurity diffusion region in the first well, and simultaneously, forming the first conductivity type fifth impurity diffusion region in the second well.

According to the manufacturing method of a semiconductor device according to the first aspect of the invention, a lateral bipolar transistor can be formed in which the first impurity diffusion region or the like is a base region, the third impurity diffusion region and the fourth impurity diffusion region are respectively an emitter region and a collector region. Also, a lateral zener diode can be formed in which the second impurity diffusion region or the like is a cathode region or an anode region, and the fifth impurity diffusion region is an anode region or a cathode region.

A manufacturing method of a semiconductor device according to the second aspect of the invention includes, in addition to the aforementioned aspect, forming, in the semiconductor substrate, a second conductivity type third buried diffusion layer simultaneously with forming the first buried diffusion layer and the second buried diffusion layer simultaneously; forming, in the semiconductor layer, a second conductivity type sixth impurity diffusion region that surrounds a third region of the semiconductor layer on the third buried diffusion layer in plan view, simultaneously with forming the first impurity diffusion region and the second impurity diffusion region simultaneously; forming a second conductivity type third well in the second region of the semiconductor layer simultaneously with forming the first well; forming a second conductivity type seventh impurity diffusion region in the third well; and forming a first conductivity type eighth impurity diffusion region at least on the seventh impurity diffusion region simultaneously with forming the third impurity diffusion region and the fourth impurity diffusion region and the fifth impurity diffusion region.

According to the manufacturing method of a semiconductor device according to the second aspect of the invention, a vertical zener diode can be formed in which the sixth and seventh impurity diffusion regions or the like are a cathode region or an anode region, and the eighth impurity diffusion region is an anode region or a cathode region.

A manufacturing method of a semiconductor device according to the third aspect of the invention includes, in addition to the aforementioned aspects, forming, in the semiconductor substrate, a second conductivity type fourth buried diffusion layer simultaneously with forming the first buried diffusion layer and the second buried diffusion layer simultaneously; forming a second conductivity type fourth well in a fourth region of the semiconductor layer on the fourth buried diffusion layer simultaneously with forming the first well; forming a first conductivity type ninth impurity diffusion region in the fourth well; forming a second conductivity type tenth impurity diffusion region in the fourth well; forming a gate electrode above the fourth well via an insulating film; and forming a second conductivity type eleventh impurity diffusion region in the ninth impurity diffusion region.

According to the manufacturing method of a semiconductor device according to the third aspect of the invention, an LDMOS field effect transistor can be formed in which the ninth impurity diffusion region is a body region, the tenth impurity diffusion region is a drift region or a drain region, and the eleventh impurity diffusion region is a source region.

In this way, according to the manufacturing method of a semiconductor device according to any of the aspects of the invention, as a result of simultaneously forming main constituent components of a plurality of different types of circuit elements, a semiconductor device in which a plurality of different types of circuit elements are mounted together can be manufactured without significantly increasing the manufacturing processes.

BRIEF DESCRIPTION OF THE DRAWINGS

The invention will be described with reference to the accompanying drawings, wherein like numbers reference like elements.

FIGS. 1A and 1B are diagrams illustrating a first example of a circuit element to be mounted in a semiconductor device.

FIGS. 2A and 2B are diagrams illustrating a second example of the circuit element to be mounted in the semiconductor device.

DESCRIPTION OF EXEMPLARY EMBODIMENTS

Figures 3A, 3B:
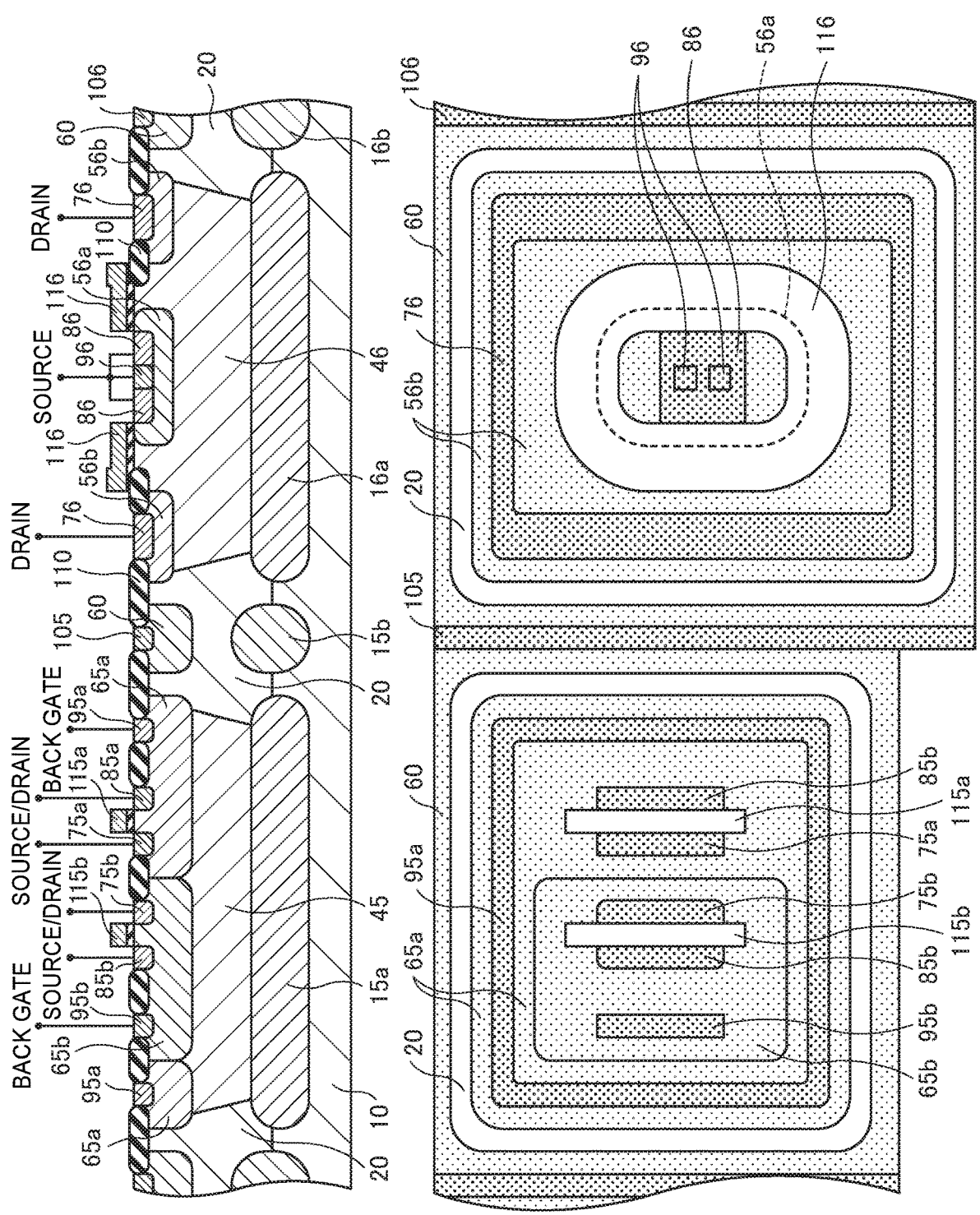
FIGS. 3A and 3B are diagrams illustrating a third example of the circuit element to be mounted in the semiconductor device.

Hereinafter, an embodiment of the invention will be described in detail, with reference to the drawings. Note that the same constituent elements are given the same reference numerals, and a redundant description is omitted.

Semiconductor Device

A semiconductor device according to one embodiment of the invention includes a plurality of different types of circuit elements. Hereinafter, examples of these circuit elements will be described with reference to FIGS. 1A to 4B. Note that the plurality of different types of circuit elements shown in FIGS. 1A to 4B are arranged on the same base substrate 10.

FIGS. 1A and 1B are diagrams illustrating a first example of the circuit element mounted in the semiconductor device according to one embodiment of the invention. The left side of FIGS. 1A and 1B shows a vertical NPN bipolar transistor, and the right side of FIGS. 1A and 1B shows a lateral PNP bipolar transistor. Also, FIG. 1A is a cross-sectional view and FIG. 1B is a plan view. Note that a field oxide film is omitted in FIG. 1B.

As shown in FIGS. 1A and 1B, the semiconductor device includes a P-type base substrate (semiconductor substrate) 10 and a P-type epitaxial layer (semiconductor layer) 20 that is arranged by epitaxially growing a P-type semiconductor on the base substrate 10. The material of the base substrate 10 and the epitaxial layer 20 is silicon (Si), for example. The epitaxial layer (semiconductor layer) 20 may be N type.

In an element region in which the vertical NPN bipolar transistor is formed (left side of FIGS. 1A and 1B), the semiconductor device includes an N-type buried diffusion layer 11a and a P-type buried diffusion layer 11b that are arranged in the base substrate 10. Portions of the buried diffusion layers 11a and 11b may extend to the epitaxial layer 20.

Also, the semiconductor device includes a deep N-well 41 arranged in a predetermined region of the epitaxial layer 20 on the N-type buried diffusion layer 11a, a P-type impurity diffusion region 51 and a shallow N-well 61 arranged in the N-well 41, and a P-well 60 arranged outside the N-well 41 in the epitaxial layer 20. The P-type impurity diffusion region 51 constitutes a base region of the vertical NPN bipolar transistor. The N-well 61, along with the N-well 41 and the N-type buried diffusion layer 11a, constitutes a collector region of the vertical NPN bipolar transistor.

In the P-type impurity diffusion region 51, an N-type impurity diffusion region 71 and a P-type impurity diffusion region 81 having a higher impurity concentration than the P-type impurity diffusion region 51 are arranged. The N-type impurity diffusion region 71 constitutes an emitter region of the vertical NPN bipolar transistor. The P-type impurity diffusion region 81 constitutes a base contact region. An electrode 111 is arranged above the P-type impurity diffusion region 51 via an insulating film (gate insulating film). The insulating film and the electrode 111 are used as a hard mask when the impurity diffusion regions 71 and 81 are formed.

An N-type impurity diffusion region 91 is arranged in the N-well 61. The N-type impurity diffusion region 91 constitutes a collector contact region. A P-type impurity diffusion region 101 is arranged in the P-well 60. The P-type impurity diffusion region 101 constitutes a substrate contact region. Field oxide films 110 that are formed using a LOCOS (Local Oxidation of Silicon) method or the like are formed around the impurity diffusion regions 81 and 91. According to the above, the vertical NPN bipolar transistor is configured.

Meanwhile, in the element region in which the lateral PNP bipolar transistor is formed (right side in FIGS. 1A and 1B), the semiconductor device includes an N-type buried diffusion layer 12a and a P-type buried diffusion layer 12b that are arranged in the base substrate 10. Portions of the buried diffusion layers 12a and 12b may extend to the epitaxial layer 20.

Also, the semiconductor device includes an N-type impurity diffusion region (N-plug) 32 that is arranged in the epitaxial layer 20 and surrounds a predetermined region of the epitaxial layer 20 on the N-type buried diffusion layer 12a in plan view, a deep N-well 42 that is arranged in the predetermined region of the epitaxial layer 20, and the P-well 60 that is arranged outside the N-plug 32 in the epitaxial layer 20. Note that the expression "in plan view" as used herein refers to viewing portions in a direction vertical to a principal surface (upper surface in the diagram) of the epitaxial layer 20. The N-plug 32, along with the N-well 42 and the N-type buried diffusion layer 12a, constitutes a base region of the lateral PNP bipolar transistor.

An N-type impurity diffusion region 72 having a higher impurity concentration than the N-plug 32 is arranged in the N-plug 32. The N-type impurity diffusion region 72 constitutes a base contact region. P-type impurity diffusion regions 82 and 92 are arranged in the N-well 42. The P-type impurity diffusion region 82 constitutes an emitter region of the lateral PNP bipolar transistor, and the P-type impurity diffusion region 92 constitutes a collector region of the lateral PNP bipolar transistor.

A P-type impurity diffusion region 102 is arranged in the P-well 60. The P-type impurity diffusion region 102 constitutes a substrate contact region. The field oxide films 110 are arranged around the impurity diffusion regions 72, 82, and 92. Accordingly, the lateral PNP bipolar transistor is configured.

FIGS. 2A and 2B are diagrams illustrating a second example of the circuit element mounted in the semiconductor device according to one embodiment of the invention. The left side of FIGS. 2A and 2B shows a vertical zener diode, and the right side of FIGS. 2A and 2B shows a lateral zener diode. Also, FIG. 2A is a cross-sectional view and FIG. 2B is a plan view. Note that a field oxide film is omitted in FIG. 2B.

As shown in FIGS. 2A and 2B, the semiconductor device includes, in an element region in which the vertical zener diode is formed (left side in FIGS. 2A and 2B), an N-type buried diffusion layer 13a and a P-type buried diffusion layer 13b that are arranged in the base substrate 10. Portions of the buried diffusion layers 13a and 13b may extend to the epitaxial layer 20.

Also, the semiconductor device includes an N-type impurity diffusion region (N-plug) 33 that is arranged in the epitaxial layer 20 and surrounds a predetermined region of the epitaxial layer 20 on the N-type buried diffusion layer 13a in plan view, a deep N-well 43 arranged in the predetermined region of the epitaxial layer 20, and the P-well 60 that is arranged outside the N-plug 33, in the epitaxial layer 20.

An N-type impurity diffusion region 73 is arranged in the N-well 43, and a P-type impurity diffusion region 83 is arranged at least on the N-type impurity diffusion region 73. The N-type impurity diffusion region 73, along with the N-well 43, the N-plug 33, and the N-type buried diffusion layer 13a, constitutes a cathode region of the vertical zener diode.

The concentration and shape of the N-type impurity diffusion region 73 mainly determine the breakdown voltage of the vertical zener diode. Also, the N-type buried diffusion layer 13a and the N-plug 33 can improve the element isolation properties. The P-type impurity diffusion region 83 constitutes an anode region of the vertical zener diode.

An N-type impurity diffusion region 93 having a higher impurity concentration than the N-plug 33 is arranged in the N-plug 33. The N-type impurity diffusion region 93 constitutes a cathode contact region. A P-type impurity diffusion region 103 is arranged in the P-well 60. The P-type impurity diffusion region 103 constitutes a substrate contact region. The field oxide films 110 are arranged around the impurity diffusion regions 83 and 93. According to the above, the vertical zener diode is configured. The vertical zener diode shown in FIGS. 2A and 2B has a breakdown voltage of approximately 7V to 10V, for example.

Meanwhile, in the element region in which the lateral zener diode is formed (right side in FIGS. 2A and 2B), the semiconductor device includes an N-type buried diffusion layer 14a and a P-type buried diffusion layer 14b that are arranged in the base substrate 10. Portions of the buried diffusion layers 14a and 14b may extend to the epitaxial layer 20.

Also, the semiconductor device includes an N-type impurity diffusion region (N-plug) 34a that is arranged on the N-type buried diffusion layer 14a, in the epitaxial layer 20, and may further include an N-type impurity diffusion region (N-plug) 34b that is arranged in the epitaxial layer 20 and surrounds a predetermined region of the epitaxial layer 20 on the N-type buried diffusion layer 14a in plan view. The N-plugs 34a and 34b, along with the N-type buried diffusion layer 14a, constitutes a cathode region of the lateral zener diode.

An N-type impurity diffusion region 74 having a higher impurity concentration than the N-plug 34a is arranged in the N-plug 34a, and an N-type impurity diffusion region 84 having higher impurity concentration than the N-plug 34b is arranged in the N-plug 34b. The N-type impurity diffusion regions 74 and 84 constitutes a cathode contact region.

Furthermore, the semiconductor device includes a P-well 64 that is arranged, in the epitaxial layer 20, in a region in contact with the N-plug 34a, and the P-well 60 that is arranged, in the epitaxial layer 20, outside the N-plug 34b. The P-well 64 constitutes an anode region of the lateral zener diode.

A P-type impurity diffusion region 94 is arranged in the P-well 64. The P-type impurity diffusion region 94 constitutes an anode contact region. A P-type impurity diffusion region 104 is arranged in the P-well 60. The P-type impurity diffusion region 104 constitutes a substrate contact region. The field oxide films 110 are arranged around the impurity diffusion regions 74, 84, and 94. According to the above, the lateral zener diode is configured.

Here, at least the N-plug 34a and the N-type buried diffusion layer 14a have a high impurity concentration, are provided in a wide region, and are in contact with the epitaxial layer 20 having low impurity concentration, and as a result, the lateral zener diode shown in FIGS. 2A and 2B has a high breakdown voltage of approximately 16 V to 22 V, for example.

FIGS. 3A and 3B are diagrams illustrating a third example of the circuit element mounted in the semiconductor device according to one embodiment of the invention. The left side of FIGS. 3A and 3B shows a CMOS field effect transistor, and the right side of FIGS. 3A and 3B shows an LD (Lateral Double-diffused) MOS field effect transistor. Also, FIG. 3A is a cross-sectional view and FIG. 3B is a plan view. Note that a field oxide film is omitted in FIG. 3B.

As shown in FIGS. 3A and 3B, the semiconductor device includes, in the element region in which the CMOS field effect transistor is formed (left side in FIGS. 3A and 3B), an N-type buried diffusion layer 15a and a P-type buried diffusion layer 15b that are arranged in the base substrate 10. Portions of the buried diffusion layers 15a and 15b may extend to the epitaxial layer 20.

Also, the semiconductor device includes a deep N-well 45 that is arranged in a predetermined region of the epitaxial layer 20 on the N-type buried diffusion layer 15a, a shallow N-well 65a and a P-well 65b that are arranged in the N-well 45, and the P-well 60 that is arranged, in the epitaxial layer 20, outside the N-well 45. The N-well 65a constitutes a back gate region of a P-channel MOS field effect transistor, and the P-well 65b constitutes a back gate region of an N-channel MOS field effect transistor.

P-type impurity diffusion regions 75a and 85a and N-type impurity diffusion region 95a are arranged in the N-well 65a. The P-type impurity diffusion regions 75a and 85a constitute source and drain regions of the P-channel MOS field effect transistor, and the N-type impurity diffusion region 95a constitutes a back gate contact region. A gate electrode 115a is arranged above the N-well 65a via a gate insulating film.

N-type impurity diffusion regions 75b and 85b and a P-type impurity diffusion region 95b are arranged in the P-well 65b. The N-type impurity diffusion regions 75b and 85b constitute source and drain regions of the N-channel MOS field effect transistor, and the P-type impurity diffusion region 95b constitutes a back gate contact region. A gate electrode 115b is arranged above the P-well 65b via a gate insulating film.

A P-type impurity diffusion region 105 is arranged in the P-well 60. The P-type impurity diffusion region 105 constitutes a substrate contact region. The field oxide films 110 are arranged around the impurity diffusion region 75a and the like. According to the above, the CMOS field effect transistor is configured.

Meanwhile, in the element region in which the LDMOS field effect transistor is formed (right side in FIGS. 3A and 3B), the semiconductor device includes an N-type buried diffusion layer 16a and a P-type buried diffusion layer 16b that are arranged in the base substrate 10. Portions of the buried diffusion layers 16a and 16b may extend to the epitaxial layer 20.

Also, the semiconductor device includes a deep N-well 46 that is arranged in a predetermined region of the epitaxial layer 20 on the N-type buried diffusion layer 16a, a P-type impurity diffusion region 56a and an N-type impurity diffusion region 56b that are arranged in the N-well 46, and the P-well 60 that is arranged, in the epitaxial layer 20, outside the N-well 46.

The P-type impurity diffusion region 56a constitutes a body region of the LDMOS field effect transistor. The N-type impurity diffusion region 56b constitutes a drift region through which current flows between a drain region and the body region in the LDMOS field effect transistor, or a portion of the drain region. Note that the N-type impurity diffusion region 56b may be omitted.

An N-type impurity diffusion region 86 and a P-type impurity diffusion region 96 having a higher impurity concentration than the P-type impurity diffusion region 56a are arranged in the P-type impurity diffusion region 56a. The N-type impurity diffusion region 86 constitutes a source region of the LDMOS field effect transistor, and the P-type impurity diffusion region 96 constitutes a body contact region.

An N-type impurity diffusion region 76 having a higher impurity concentration than the N-type impurity diffusion region 56b is arranged in the N-type impurity diffusion region 56b. The N-type impurity diffusion region 76 constitutes the drain region of the LDMOS field effect transistor. A gate electrode 116 is arranged above the N-well 46 via an insulating film (gate insulating film or field oxide film 110).

A P-type impurity diffusion region 106 is arranged in the P-well 60. The P-type impurity diffusion region 106 constitutes a substrate contact region. The field oxide films 110 are arranged around the N-type impurity diffusion region 76. According to the above, the LDMOS field effect transistor is configured.

Figure 4A:
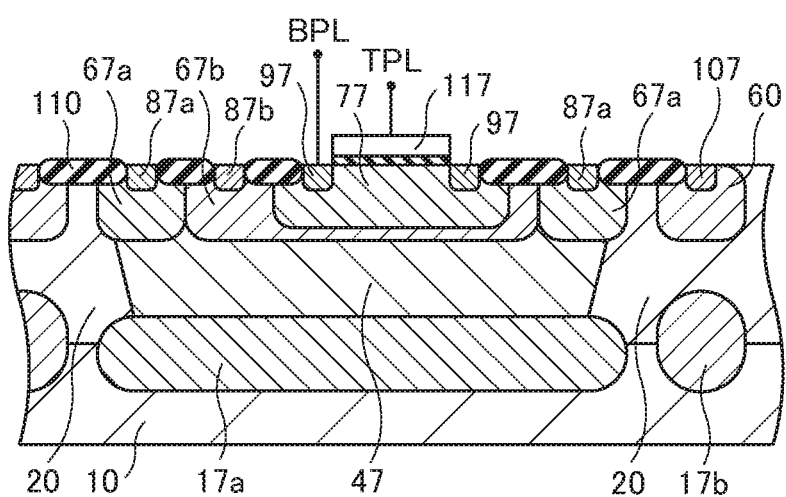
FIGS. 4A and 4B are diagrams illustrating a fourth example of the circuit element to be mounted in the semiconductor device.
Figure 4B:
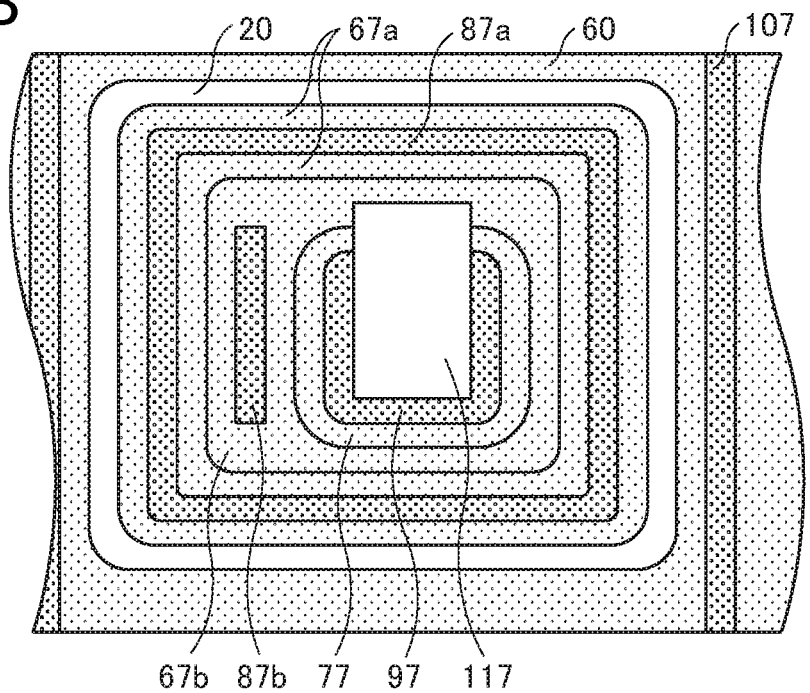

FIGS. 4A and 4B are diagrams illustrating a fourth example of the circuit element mounted in the semiconductor device according to one embodiment of the invention. FIGS. 4A and 4B show a capacitor that is formed using a MOS structure. Also, FIG. 4A is a cross-sectional view and FIG. 4B is a plan view. Note that a field oxide film is omitted in FIG. 4B.

As shown in FIGS. 4A and 4B, the semiconductor device includes, in the element region in which the capacitor is formed, an N-type buried diffusion layer 17a and a P-type buried diffusion layer 17b that are arranged in the base substrate 10. Portions of the buried diffusion layers 17a and 17b may extend to the epitaxial layer 20.

Also, the semiconductor device includes a deep N-well 47 that is arranged in a predetermined region of the epitaxial layer 20 on the N-type buried diffusion layer 17a, a shallow N-well 67a and a P-well 67b that are arranged in the N-well 47, and the P-well 60 that is arranged, in the epitaxial layer 20, outside the N-well 47.

An N-type impurity diffusion region 87a is arranged in the N-well 67a. The N-type impurity diffusion region 87a is used to apply a potential to the N-well 67a. An N-type impurity diffusion region 77 and a P-type impurity diffusion region 87b are arranged in the P-well 67b. The N-type impurity diffusion region 77 constitutes a first electrode BPL of the capacitor, and the P-type impurity diffusion region 87b is used to apply a potential to the P-well 67b.

An N-type impurity diffusion region 97 having a higher impurity concentration than the N-type impurity diffusion region 77 is arranged in the N-type impurity diffusion region 77. The N-type impurity diffusion region 97 constitutes a contact region of the first electrode. An insulating film (gate insulating film) is arranged on the N-type impurity diffusion region 77, and an electrode 117 is arranged on the insulating film. The electrode 117 constitutes a second electrode TPL of the capacitor.

A P-type impurity diffusion region 107 is arranged in the P-well 60. The P-type impurity diffusion region 107 constitutes a substrate contact region. The field oxide films 110 are arranged around the impurity diffusion regions 87a and 87b. According to the above, the capacitor is configured.

Here, the P-well 67b is arranged so as to surround the N-type impurity diffusion region 77, in the epitaxial layer 20. Also, the N-wells 47 and 67a are arranged so as to surround the P-well 67b, in the epitaxial layer 20. As a result of providing the P-well 67b that surrounds the N-type impurity diffusion region 77 and the N-wells 47 and 67a that surround the P-well 67b in the epitaxial layer 20, in this way, insulation property of the first electrode of the capacitor can be improved.

According to the present embodiment, various circuits can be realized by mounting a plurality of different types of circuit elements together in the same semiconductor device while the basic structure that is constituted by the buried diffusion layer arranged in the base substrate 10 and the impurity diffusion region (plug) or the well that are arranged in the epitaxial layer 20 on the buried diffusion layer is used in common.

Manufacturing Method

Next, a manufacturing method of the semiconductor device according to one embodiment of the invention will be described. With the manufacturing method of the semiconductor device according to one embodiment of the invention, the semiconductor device in which a plurality of different types of circuit elements are mounted can be manufactured. Hereinafter, manufacturing processes of these circuit elements will be described with reference to FIGS. 5A to 8J. Note that the manufacturing processes of the plurality of different types of circuit elements shown in FIGS. 5A to 8J are performed on the same base substrate 10.

Figure 5A:
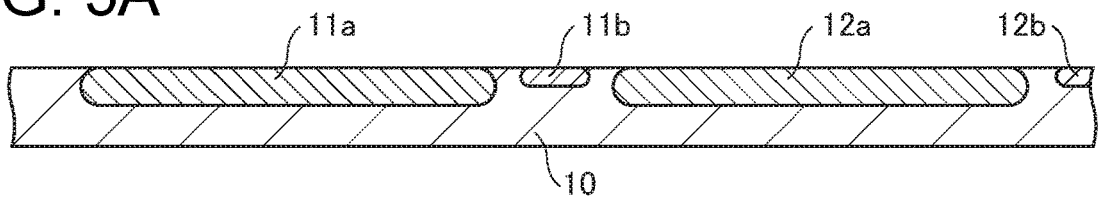
FIGS. 5A to 5J are cross-sectional views of a manufacturing process of the first example of the circuit element to be mounted in the semiconductor device.
Figure 5B:
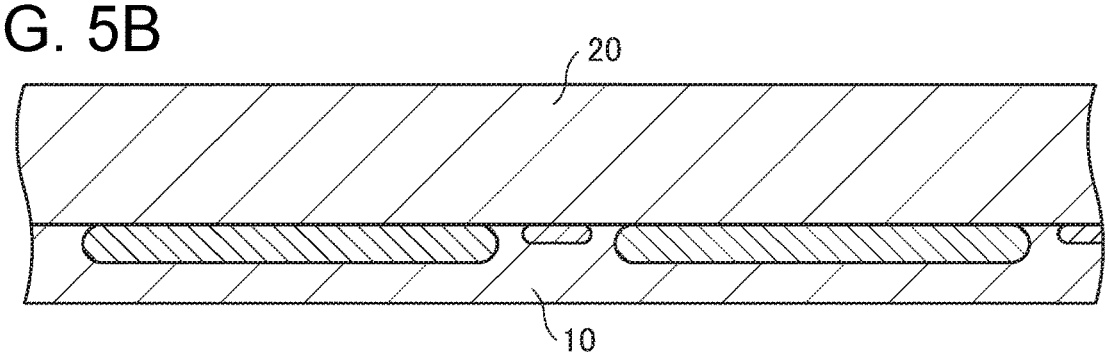
Figure 5C:
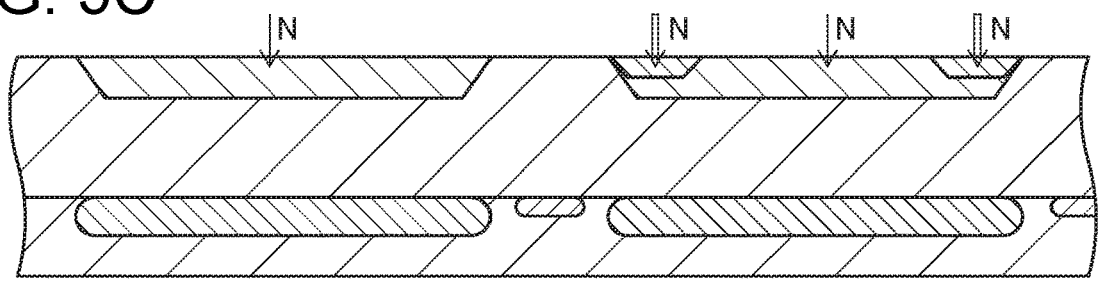

FIGS. 5A to 8J are cross-sectional views, of the manufacturing processes, of the first to fourth examples of the circuit elements mounted in the semiconductor device according to one embodiment of the invention. The left side of FIGS. 5A and 5J shows manufacturing processes of the vertical NPN bipolar transistor, and the right side of FIGS. 5A and 5J shows manufacturing processes of the lateral PNP bipolar transistor.

Figure 6A:
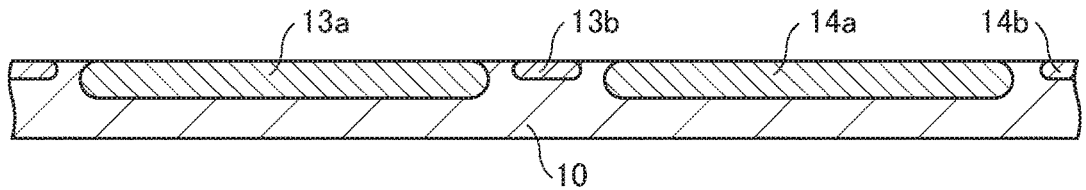
FIGS. 6A to 6J are cross-sectional views of a manufacturing process of the second example of the circuit element to be mounted in the semiconductor device.
Figure 6B:
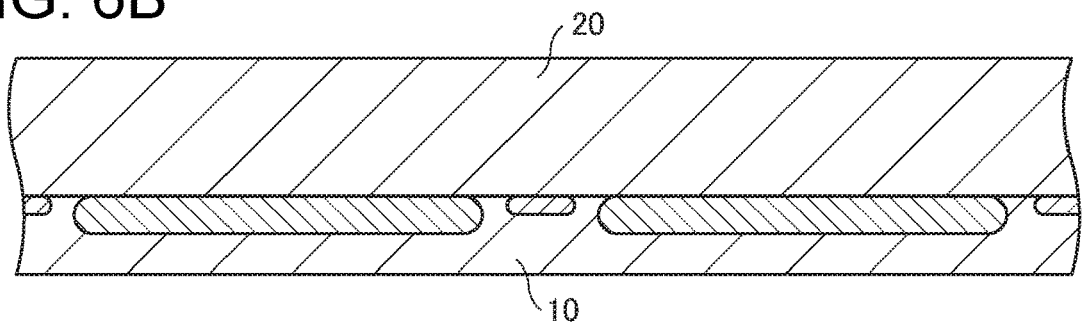
Figure 6C:
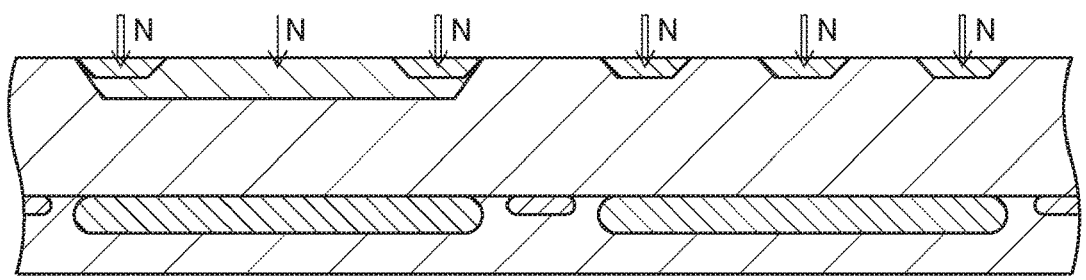
Figure 6D:
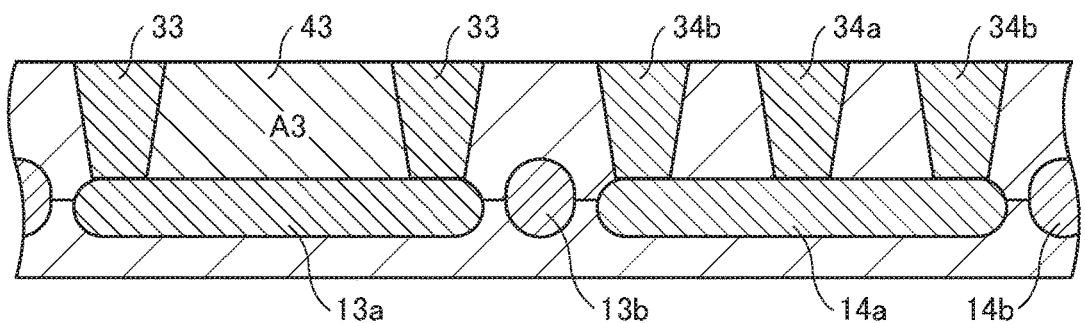
Figure 6E:
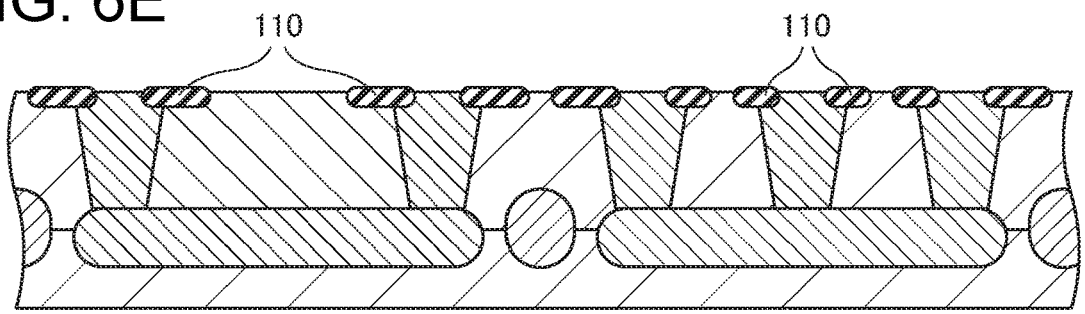
Figure 6F:
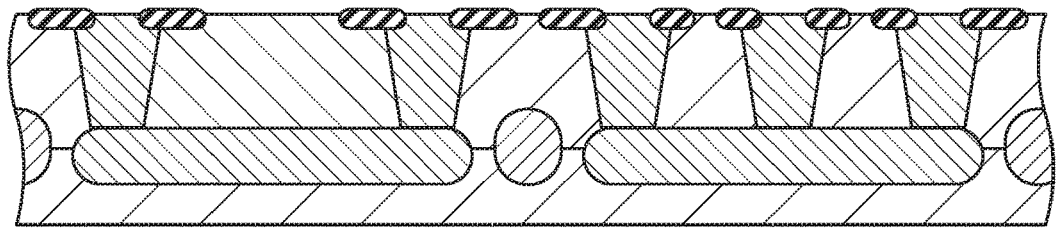
Figure 6G:
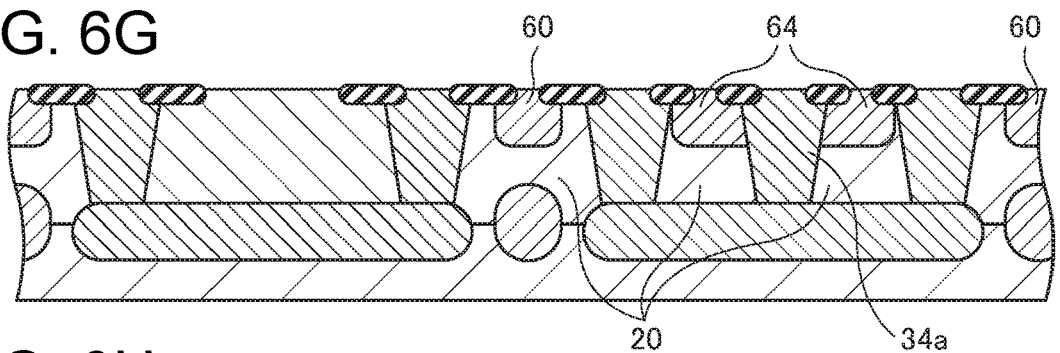
Figure 6H:
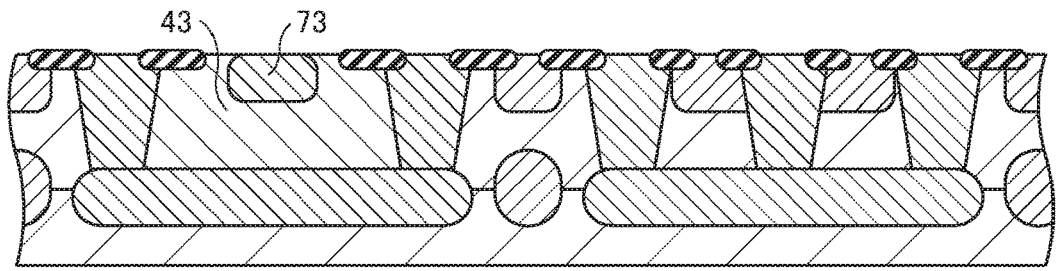
Figure 6I:
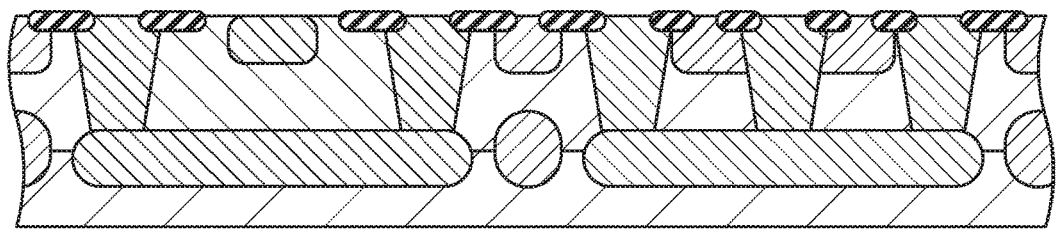
Figure 6J:
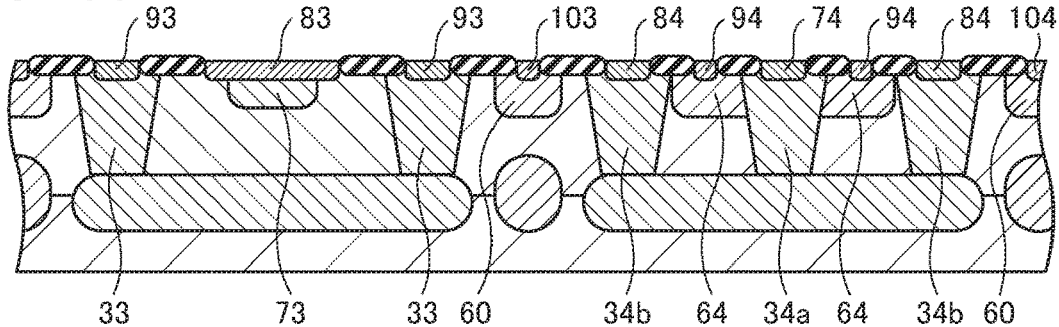
Figure 7A:
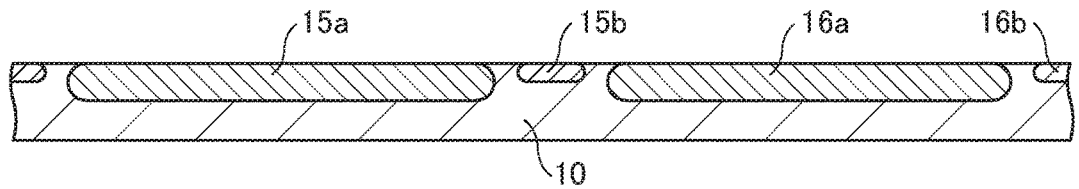
FIGS. 7A to 7J are cross-sectional views of a manufacturing process of the third example of the circuit element to be mounted in the semiconductor device.
Figure 7B:
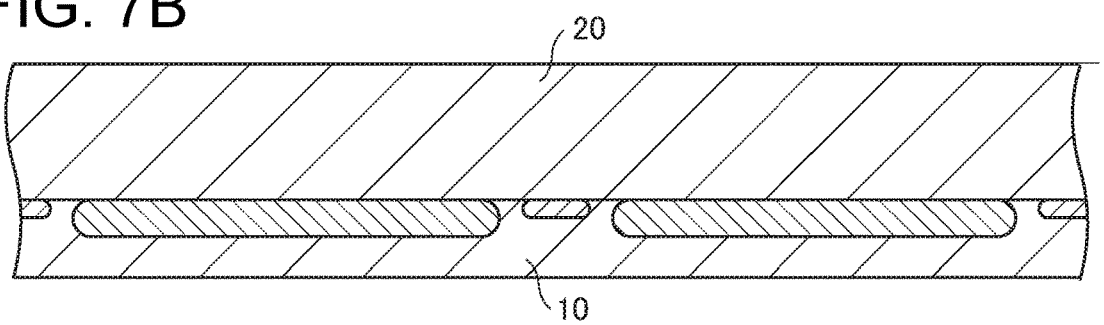
Figure 7C:
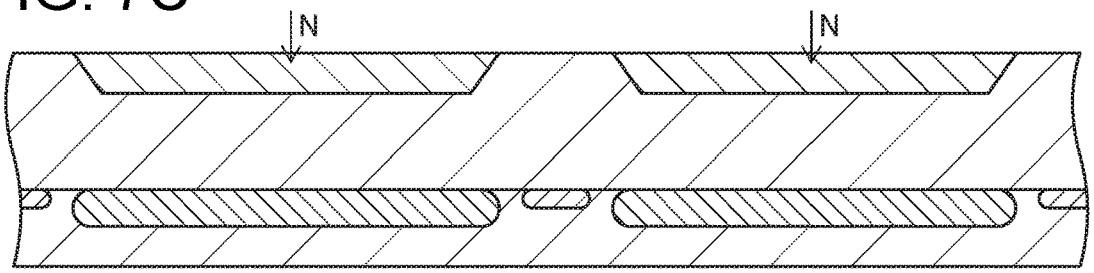
Figure 7D:
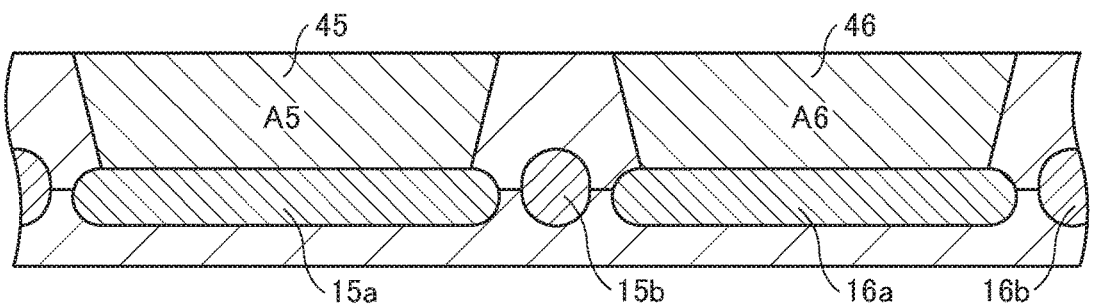
Figure 7E:
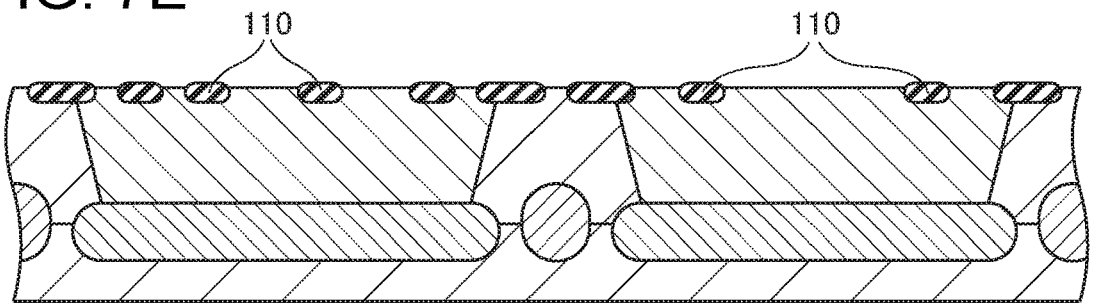
Figure 7J:
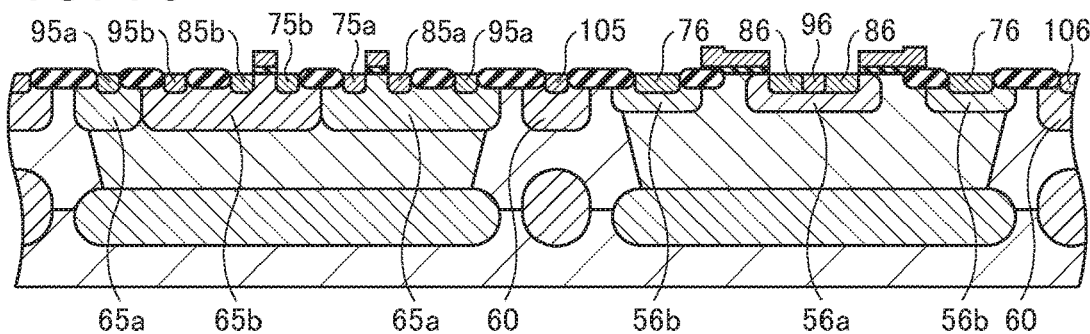
Figure 8A:
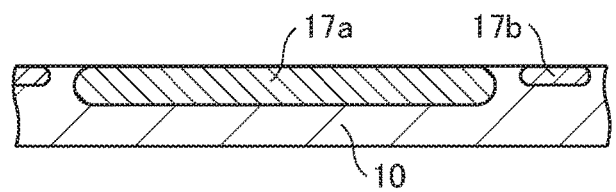
FIGS. 8A to 8J are cross-sectional views of a manufacturing process of the fourth example of the circuit element to be mounted in the semiconductor device.
Figure 8B:
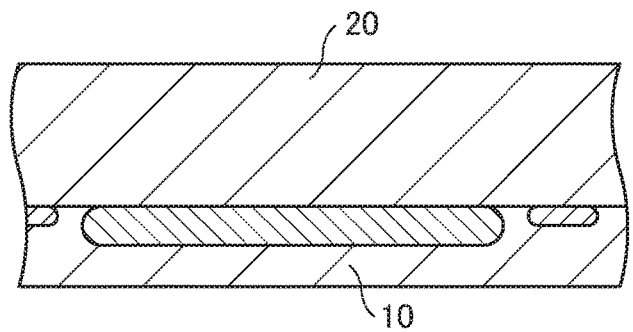
Figure 8C:
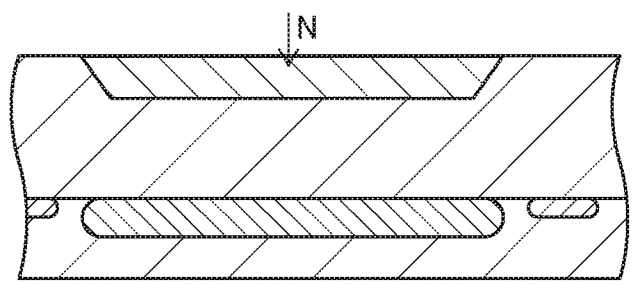
Figure 8D:
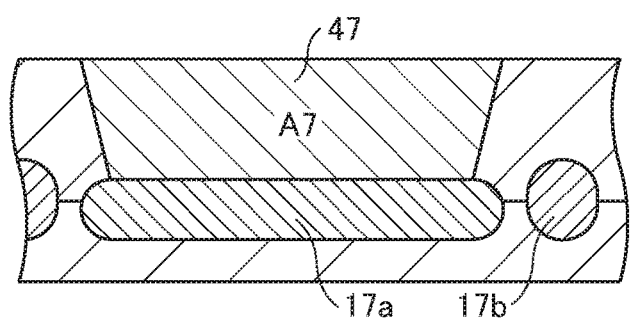
Figure 8E:
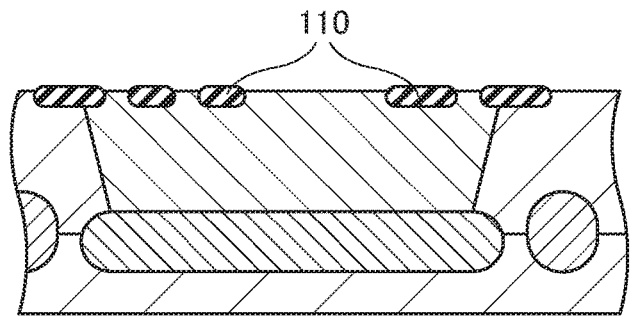
Figure 8F:
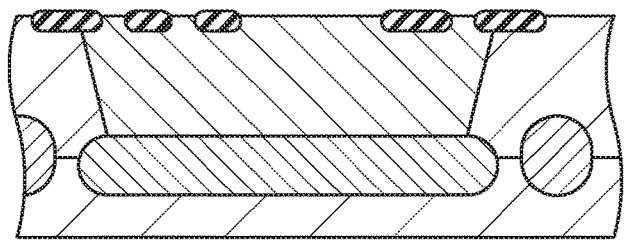
Figure 8G:
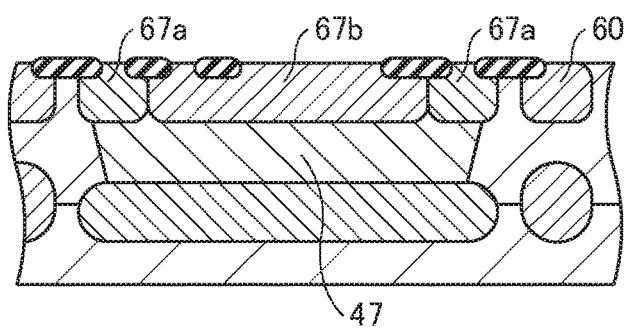

Also, the left side of FIGS. 6A and 6J shows manufacturing processes of the vertical zener diode, and the right side of FIGS. 6A and 6J shows manufacturing processes of the lateral zener diode. The left side of FIGS. 7A and 7J shows manufacturing processes of the CMOS field effect transistor, and the right side of FIGS. 7A and 7J shows manufacturing processes of the LDMOS field effect transistor. FIGS. 8A and 8J show manufacturing processes of the capacitor that is formed using a MOS structure.

First, a silicon (Si) substrate including boron (B) or the like, as a P-type impurity, is prepared as the P-type base substrate (semiconductor substrate) 10, for example. N-type impurities such as antimony (Sb) or phosphorus (P) ions are simultaneously implanted into a first group of regions of the base substrate 10 using a mask formed using a photolithography method, and P-type impurities such as boron (B) ions are simultaneously implanted into a second group of regions. Thereafter, as a result of the impurities being thermally diffused, the N-type buried diffusion layers 11a to 17a are simultaneously formed, and the P-type buried diffusion layers 11b to 17b are simultaneously formed, as shown in FIGS. 5A, 6A, 7A, and 8A.

Next, as shown in FIGS. 5B, 6B, 7B, and 8B, the P-type epitaxial layer (semiconductor layer) 20 is formed on the base substrate 10 by epitaxial growth. For example, as a result of mixing a gas containing P-type impurities such as boron (B) when the silicon layer is epitaxially grown on the silicon substrate, the P-type epitaxial layer 20 having a desired conductivity (specific resistance) can be formed. The thickness of the epitaxial layer 20 is approximately 4.5 µm to 5 µm, for example. The epitaxial layer (semiconductor layer) 20 may be N type.

Next, in the process shown in FIGS. 5C, 6C, 7C, and 8C, N-type impurities such as phosphorus (P) ions are simultaneously implanted into a plurality of regions of the epitaxial layer 20 using a mask formed using a photolithography method. For example, when the N-plugs are formed by implanting phosphorus ions into the silicon epitaxial layer, the dose is approximately $2 \times 10^{14}$ atom/cm$^2$ to $5 \times 10^{14}$ atom/cm$^2$.

Furthermore, in the process shown in FIGS. 5D, 6D, 7D, and 8D, as a result of the N-type impurities implanted into the epitaxial layer 20 being thermally diffused, the N-type impurities reach the N-type buried diffusion layers 11a to 17a, and the N-plugs 32 to 34b are simultaneously formed and the N-wells 41 to 43 and 45 to 47 are simultaneously formed.

For example, when phosphorus ions implanted into the silicon epitaxial layer are diffused, the heating temperature is approximately 1100° C. to 1150° C. Here, portions of the buried diffusion layers 11a to 17a and 11b to 17b may extend to the epitaxial layer 20 due to thermal diffusion of the impurities.

Figure 5D:
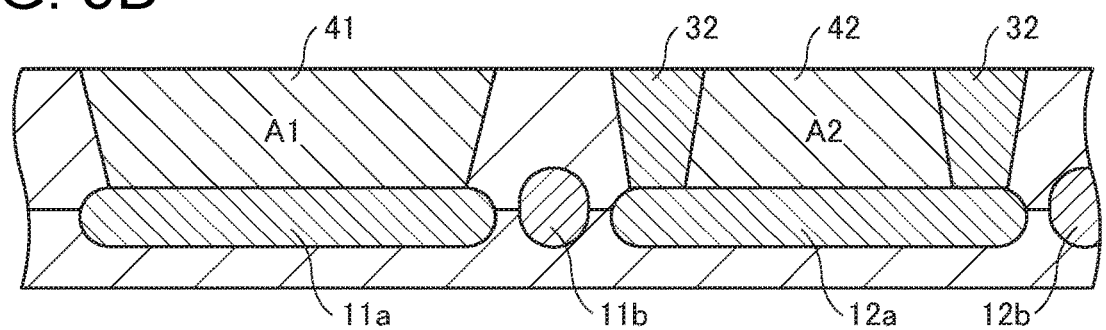
Figure 5E:
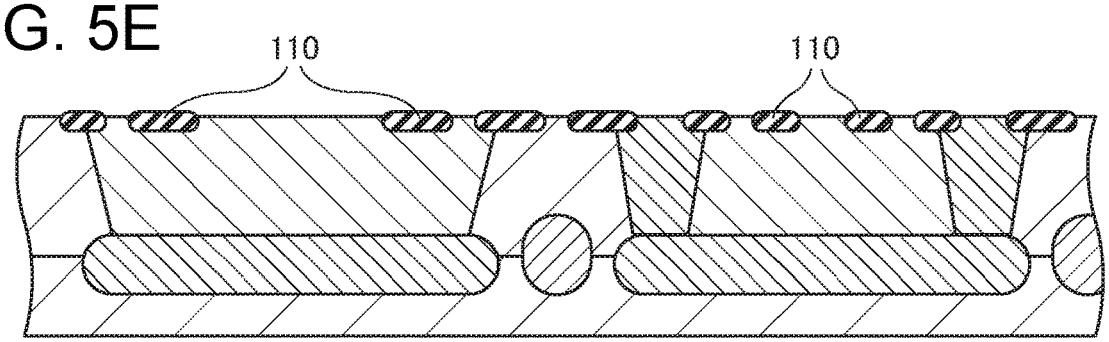

Accordingly, as shown in FIG. 5D, the N-plug 32 that surrounds a region A2 of the epitaxial layer 20 on the N-type buried diffusion layer 12a in plan view is formed in the epitaxial layer 20. Simultaneously, as shown in FIG. 6D, the N-plug 33 that surrounds a region A3 of the epitaxial layer 20 on the N-type buried diffusion layer 13a in plan view is formed in the epitaxial layer 20.

Also, along with the N-plug 34a being formed in the epitaxial layer 20 on the N-type buried diffusion layer 14a, the N-plug 34b that surrounds a region A4 of the epitaxial layer 20 on the N-type buried diffusion layer 14a in plan view is formed in the epitaxial layer 20. Furthermore, the N-wells 41 to 43 and 45 to 47 are formed simultaneously in the regions A1 to A3 and regions A5 to A7 of the epitaxial layer 20.

Next, in the process shown in FIGS. 5E, 6E, 7E, and 8E, the field oxide films 110 are formed in predetermined regions of a principal surface (upper surface in the diagram) of the epitaxial layer 20 using a LOCOS method, for example. Note that the field oxide films 110 may be formed after the impurity diffusion region 56a and the like have been formed.

Figure 5F:
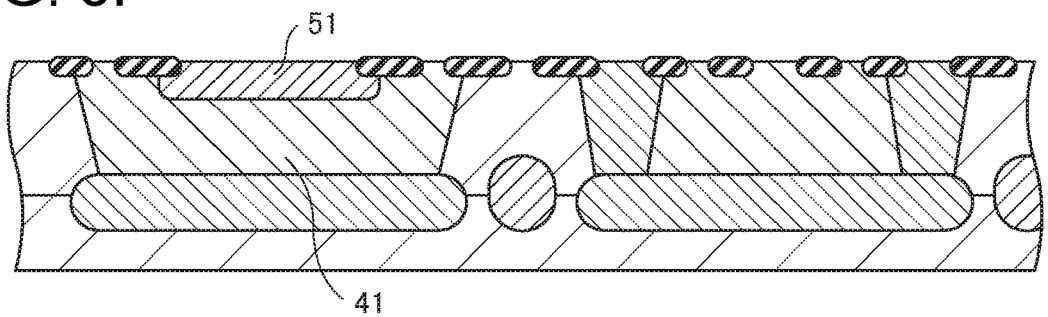
Figure 7F:
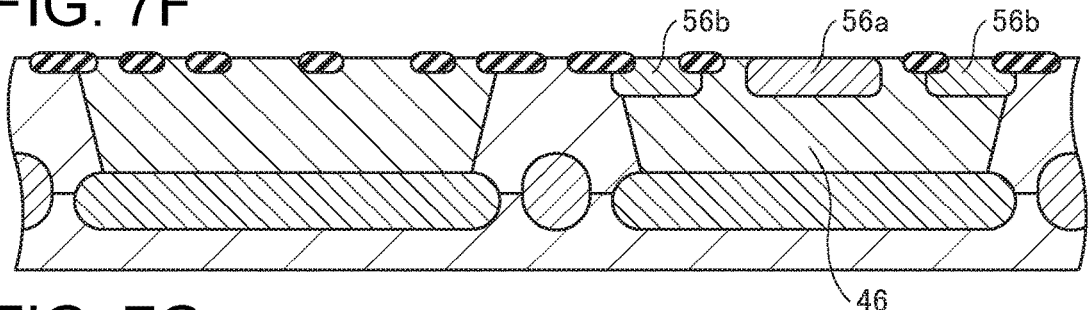

Next, in the process shown in FIGS. 5F and 7F, P-type impurities such as boron (B) ions are implanted into partial regions of N-wells 41 and 46 using a mask formed using a photolithography method. Accordingly, the P-type impurity diffusion region (base region) 51 is formed in the N-well 41 as shown in FIG. 5F, and simultaneously, the P-type impurity diffusion region (body region) 56a is formed in the N-well 46 as shown in FIG. 7F.

Also, in the process shown in FIG. 7F, N-type impurities such as phosphorus (P) ions are implanted into another partial region of the N-well 46 using a mask formed using a photolithography method. Accordingly, as shown in FIG. 7F, the N-type impurity diffusion region (drift region or drain region) 56b is formed in the N-well 46.

Figure 5G:
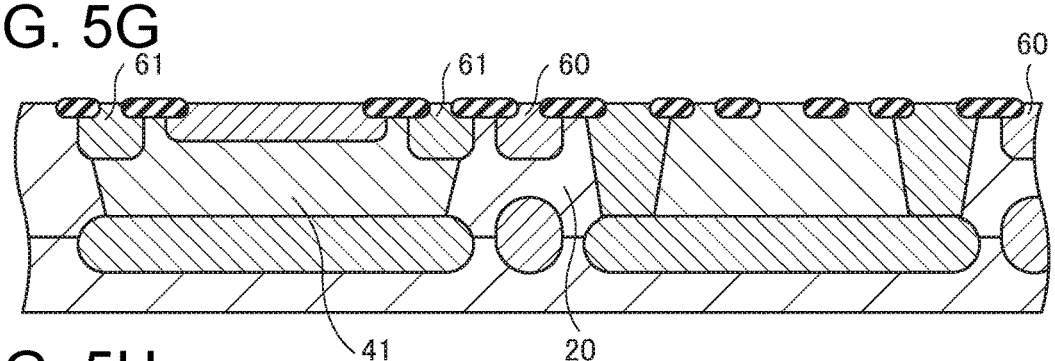
Figure 5H:
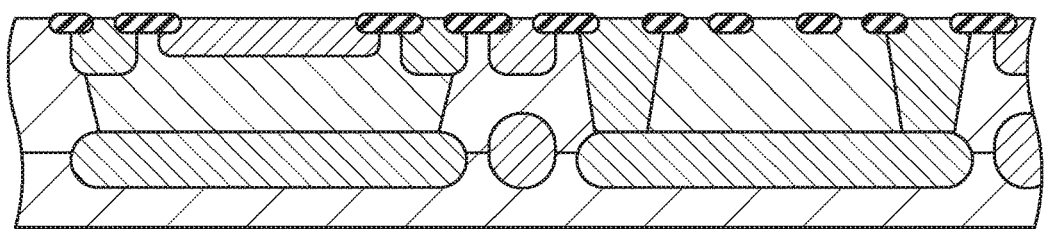
Figure 7G:
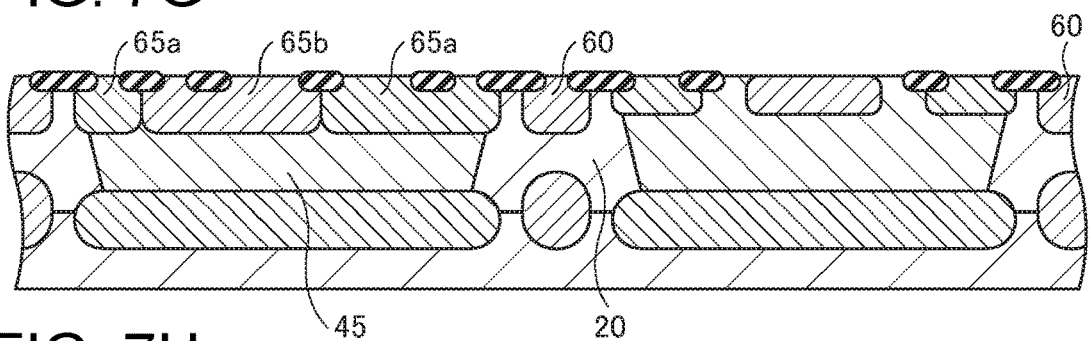
Figure 7H:
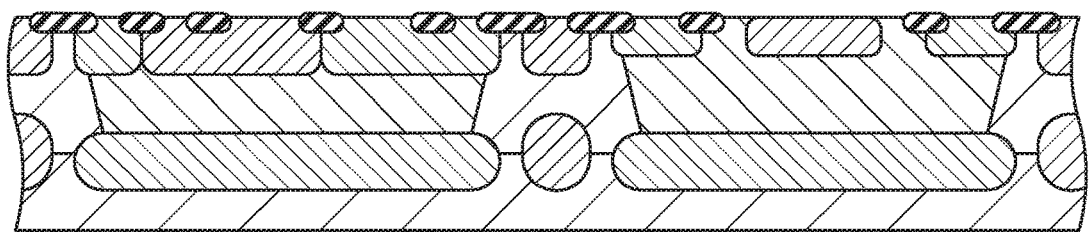

Next, N-type impurities such as phosphorus (P) ions are implanted into partial regions of the deep N-wells using a mask formed using a photolithography method. Accordingly, as shown in FIG. 5G, the shallow N-well 61 is formed in the deep N-well 41. Simultaneously, the shallow N-well 65a is formed in the deep N-well 45 as shown in FIG. 7G, and the shallow N-well 67a is formed in the deep N-well 47 as shown in FIG. 8G.

Also, P-type impurities such as boron (B) ions are implanted into other partial regions of the epitaxial layer 20 or the deep N-wells using a mask formed using a photolithography method. Accordingly, as shown in FIGS. 5G, 6G, 7G, and 8G, the shallow P-wells 60 are formed in the epitaxial layer 20.

Simultaneously, as shown in FIG. 6G, the shallow P-well 64 is formed in the epitaxial layer 20 in a region that is in contact with the N-plug 34a. Also, the shallow P-well 65b is formed in the deep N-well 45 as shown in FIG. 7G, and the shallow P-well 67b is formed in the deep N-well 47 as shown in FIG. 8G.

Figure 8H:
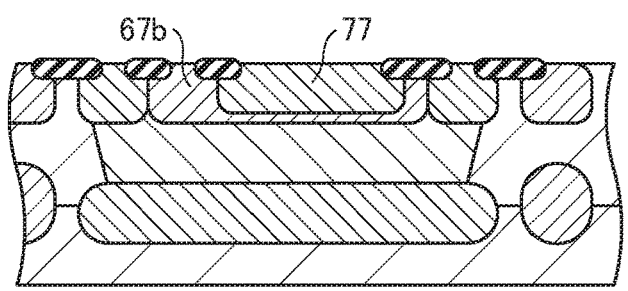

Next, in the process shown in FIGS. 6H and 8H, N-type impurities such as phosphorus (P) ions are simultaneously implanted into partial regions of the N-well 43 and the P-well 67b using a mask formed using a photolithography method. Accordingly, the N-type impurity diffusion region 73 is formed in the deep N-well 43 as shown in FIG. 6H, and the N-type impurity diffusion region 77 is formed in the P-well 67b as shown in FIG. 8H.

In the case where the N-type impurity diffusion region is formed by implanting phosphorus ions into the silicon epitaxial layer, the conditions of implantation are as follows. The acceleration voltage is approximately 100 keV to 150 keV, and the dose is approximately $2 \times 10^{13}$ atom/cm$^2$ to $6 \times 10^{13}$ atom/cm$^2$. In this way, a cathode of the zener diode having a breakdown voltage of approximately 7 V to 10 V, and an impurity diffusion region of the capacitor in which abnormal growth of oxide film can be suppressed can be simultaneously formed.

Next, the gate insulating film (not shown) is formed on the principal surface of the epitaxial layer 20 by thermally oxidizing the principal surface of the epitaxial layer 20, for example. Accordingly, the gate insulating film is formed on the P-type impurity diffusion region 51 shown in FIG. 5I. Simultaneously, the gate insulating films are formed on the N-well 65a, the P-well 65b, and the N-well 46 shown in FIG. 7I. Also, the gate insulating film is formed on the N-type impurity diffusion region 77 shown in FIG. 8I.

Figure 5I:
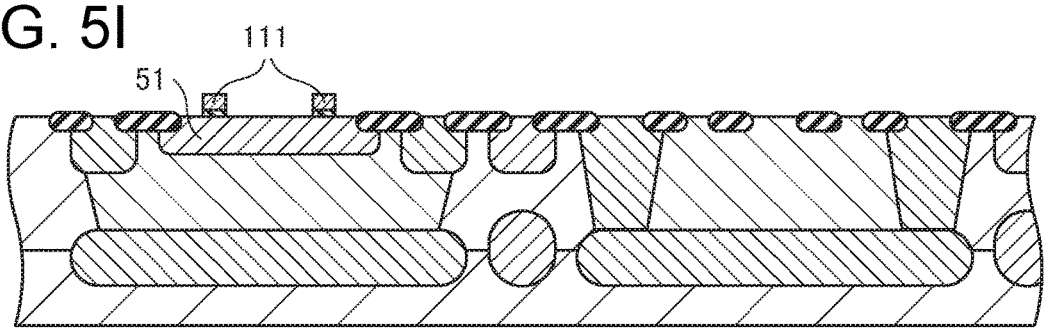
Figure 7I:
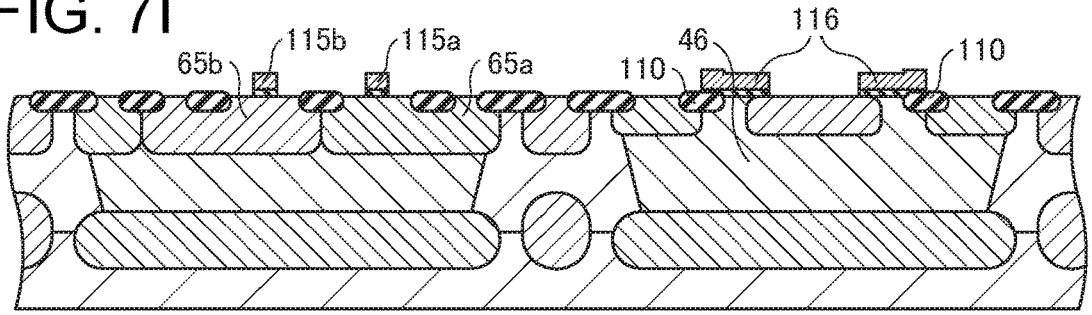

Furthermore, electrodes or gate electrodes are formed on the gate insulating films. Accordingly, as shown in FIG. 5I, the electrode 111 is formed above the P-type impurity diffusion region 51 via the gate insulating film. Simultaneously, as shown in FIG. 7I, the gate electrode 115a is formed above the N-well 65a via the gate insulating film, the gate electrode 115b is formed above the P-well 65b via the gate insulating film, and the gate electrode 116 is formed above the N-well 46 via the gate insulating film or the field oxide film 110.

Figure 8I:
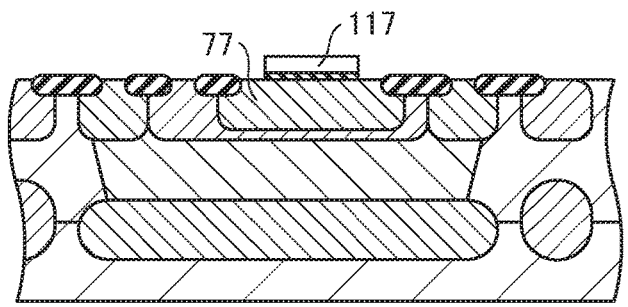
Figure 8J:
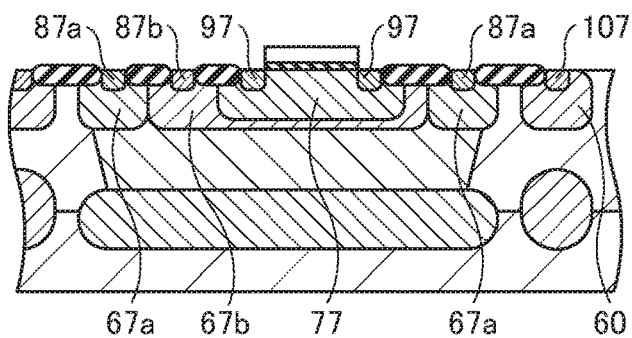

Also, as shown in FIG. 8I, the electrode 117 is formed above the N-type impurity diffusion region 77 via the gate insulating film. The electrodes 111 and 117 and the gate electrodes 115a, 115b, and 116 are made of polysilicon that is doped with impurities and has conductivity, or the like, for example.

Figure 5J:
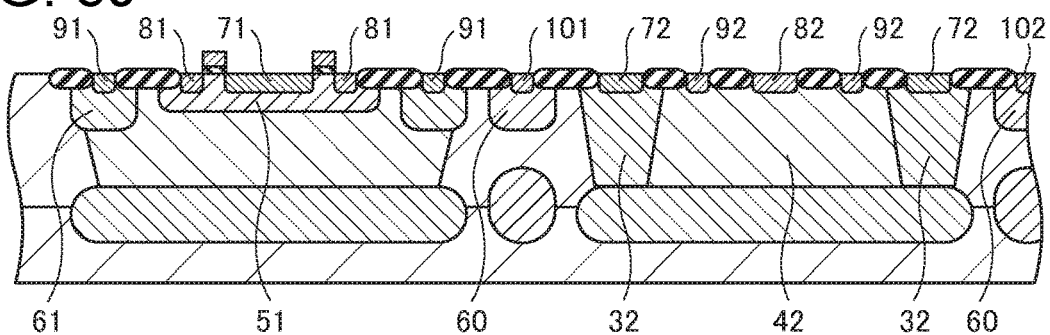

Next, in the process shown in FIGS. 5J, 6J, 7J, and 8J, N-type impurities such as phosphorus (P) ions are implanted into various wells and impurity diffusion regions. Accordingly, as shown in FIG. 5J, the N-type impurity diffusion region 71 is formed in the P-type impurity diffusion region 51, and the N-type impurity diffusion region 91 is formed in the N-well 61. Simultaneously, the N-type impurity diffusion region 72 is formed in the N-plug 32.

Also, as shown in FIG. 6J, the N-type impurity diffusion region 93 is formed in the N-plug 33, the N-type impurity diffusion regions 74 and 84 are respectively formed in the N-plugs 34a and 34b. Also, as shown in FIG. 7J, the N-type impurity diffusion region 95a is formed in the N-well 65a, the N-type impurity diffusion regions 75b and 85b are formed in the P-well 65b, the N-type impurity diffusion region 86 is formed in the P-type impurity diffusion region 56a, and the N-type impurity diffusion region 76 is formed in the N-type impurity diffusion region 56b. Also, as shown in FIG. 8J, the N-type impurity diffusion region 87a is formed in the N-well 67a, and the N-type impurity diffusion region 97 is formed in the N-type impurity diffusion region 77.

Furthermore, P-type impurities such as boron (B) ions are implanted into various wells and impurity diffusion regions. Accordingly, as shown in FIGS. 5J, 6J, 7J, and 8J, the P-type impurity diffusion regions 101 to 107 are each formed in the P-well 60. Simultaneously, as shown in FIG. 5J, the P-type impurity diffusion region 81 is formed in the P-type impurity diffusion region 51, and the P-type impurity diffusion regions 82 and 92 are formed in the N-well 42.

Also, as shown in FIG. 6J, the P-type impurity diffusion region 83 is formed at least on the N-type impurity diffusion region 73, and the P-type impurity diffusion region 94 is formed in the P-well 64. Also, as shown in FIG. 7J, the P-type impurity diffusion regions 75a and 85a are formed in the N-well 65a, the P-type impurity diffusion region 95b is formed in the P-well 65b, and the P-type impurity diffusion region 96 is formed in the P-type impurity diffusion region 56a. Also, as shown in FIG. 8J, the P-type impurity diffusion region 87b is formed in the P-well 67b.

In the process of implanting impurities, the field oxide films 110, the electrodes 111 and 117, the gate electrodes 115a, 115b, and 116 are used as a hard mask. Processes thereafter are similar to those in the manufacturing processes of a standard semiconductor device. That is, a predetermined number of interlayer insulating films and interconnect layers are formed. A contact hole is formed in an interlayer insulating film above each of the contact regions and the gate electrodes, and an interconnect made of aluminum (Al) or the like, or a plug made of tungsten (W) or the like is connected to each of the contact regions and the gate electrodes.

According to the manufacturing method of the semiconductor device according to the present embodiment, as a result of forming main constituent components of a plurality of different types of circuit elements at the same time, a semiconductor device in which different types of circuit elements are mounted together can be manufactured without significantly increasing the manufacturing processes. For example, main constituent components of the lateral bipolar transistor and the lateral zener diode can be formed simultaneously. Furthermore, main constituent components of the vertical zener diode or the LDMOS field effect transistor can be formed simultaneously.

The embodiment given above has been described taking a case where a P-type semiconductor substrate is used, but an N-type semiconductor substrate may be used. In this case, it is sufficient that P type and N type are reversed in other constituent components. The invention is not limited to the embodiment described above, and various modifications can be made by a person having ordinary skill in the art within the technical scope of the invention.

The entire disclosure of Japanese Patent Application No. 2015-242057, filed Dec. 11, 2015 is expressly incorporated by reference herein.

What is claimed is:

1. A semiconductor device comprising:
a first conductivity type semiconductor substrate;
a second conductivity type first buried diffusion layer and a second conductivity type second buried diffusion layer that are arranged in the semiconductor substrate;
a semiconductor layer arranged on the semiconductor substrate;
a second conductivity type first impurity diffusion region that is arranged in the semiconductor layer and surrounds a first region of the semiconductor layer on the first buried diffusion layer in plan view;
a second conductivity type second impurity diffusion region that is arranged, in the semiconductor layer, on the second buried diffusion layer;
a second conductivity type first well that is arranged in the first region of the semiconductor layer;
a first conductivity type second well that is arranged, in the semiconductor layer, in a second region that is in contact with the second impurity diffusion region;
a first conductivity type third impurity diffusion region and a first conductivity type fourth impurity diffusion region that are arranged in the first well; and
a first conductivity type fifth impurity diffusion region that is arranged in the second well, wherein
the first conductivity type semiconductor substrate, the second conductivity type first buried diffusion layer, the semiconductor layer, the second conductivity type first impurity diffusion region, the second conductivity type first well, the first conductivity type third impurity diffusion region and the first conductivity type fourth impurity diffusion region form a lateral bipolar transistor, and
the first conductivity type semiconductor substrate, the second conductivity type second buried diffusion layer, the semiconductor layer, the second conductivity type second impurity diffusion region, the first conductivity type second well, and the first conductivity type fifth impurity diffusion region form a lateral zener diode.

2. The semiconductor device according to claim 1, further comprising:
a second conductivity type third buried diffusion layer that is arranged in the semiconductor substrate;
a second conductivity type sixth impurity diffusion region that is arranged in the semiconductor layer and surrounds a third region of the semiconductor layer on the third buried diffusion layer in plan view;
a second conductivity type third well that is arranged in the third region of the semiconductor layer;
a second conductivity type seventh impurity diffusion region that is arranged in the third well; and
a first conductivity type eighth impurity diffusion region that is arranged at least on the seventh impurity diffusion region.

3. The semiconductor device according to claim 2, further comprising:

a second conductivity type fourth buried diffusion layer that is arranged in the semiconductor substrate;

a second conductivity type fourth well that is arranged in a fourth region of the semiconductor layer on the fourth buried diffusion layer;

a first conductivity type ninth impurity diffusion region that is arranged in the fourth well;

a second conductivity type tenth impurity diffusion region that is arranged in the fourth well;

a gate electrode that is arranged above the fourth well via an insulating film; and a second conductivity type eleventh impurity diffusion region that is arranged in the ninth impurity diffusion region.

4. The semiconductor device according to claim 1, further comprising:

a second conductivity type fourth buried diffusion layer that is arranged in the semiconductor substrate;

a second conductivity type fourth well that is arranged in a fourth region of the semiconductor layer on the fourth buried diffusion layer;

a first conductivity type ninth impurity diffusion region that is arranged in the fourth well;

a second conductivity type tenth impurity diffusion region that is arranged in the fourth well;

a gate electrode that is arranged above the fourth well via an insulating film; and a second conductivity type eleventh impurity diffusion region that is arranged in the ninth impurity diffusion region.

5. A manufacturing method of a semiconductor device, comprising:

forming a second conductivity type first buried diffusion layer and a second conductivity type second buried diffusion layer simultaneously in a first conductivity type semiconductor substrate;

forming a semiconductor layer on the semiconductor substrate;

forming a second conductivity type first impurity diffusion region, in the semiconductor layer, that surrounds a first region of the semiconductor layer on the first buried diffusion layer in plan view, and simultaneously, forming, in the semiconductor layer, a second conductivity type second impurity diffusion region on the second buried diffusion layer;

forming a second conductivity type first well in the first region of the semiconductor layer;

forming, in the semiconductor layer, a first conductivity type second well in a second region that is in contact with the second impurity diffusion region; and forming a first conductivity type third impurity diffusion region and a first conductivity type fourth impurity diffusion region in the first well, and simultaneously, forming a first conductivity type fifth impurity diffusion region in the second well, wherein the first conductivity type semiconductor substrate, the second conductivity type first buried diffusion layer, the semiconductor layer, the second conductivity type first impurity diffusion region, the second conductivity type first well, the first conductivity type third impurity diffusion region and the first conductivity type fourth impurity diffusion region form a lateral bipolar transistor, and the first conductivity type semiconductor substrate, the second conductivity type second buried diffusion layer, the semiconductor layer, the second conductivity type second impurity diffusion region, the first conductivity type second well, and the first conductivity type fifth impurity diffusion region form a lateral zener diode.

6. The manufacturing method of a semiconductor device according to claim 5, further comprising:

forming, in the semiconductor substrate, a second conductivity type third buried diffusion layer simultaneously with forming the first buried diffusion layer and the second buried diffusion layer simultaneously;

forming, in the semiconductor layer, a second conductivity type sixth impurity diffusion region that surrounds a third region of the semiconductor layer on the third buried diffusion layer in plan view, simultaneously with forming the first impurity diffusion region and the second impurity diffusion region simultaneously;

forming a second conductivity type third well in the second region of the semiconductor layer simultaneously with forming the first well;

forming a second conductivity type seventh impurity diffusion region in the third well; and forming a first conductivity type eighth impurity diffusion region at least on the seventh impurity diffusion region simultaneously with forming the third impurity diffusion region and the fourth impurity diffusion region and the fifth impurity diffusion region.

7. The manufacturing method of a semiconductor device according to claim 6, further comprising:

forming, in the semiconductor substrate, a second conductivity type fourth buried diffusion layer simultaneously with forming the first buried diffusion layer and the second buried diffusion layer simultaneously;

forming a second conductivity type fourth well in a fourth region of the semiconductor layer on the fourth buried diffusion layer simultaneously with forming the first well;

forming a first conductivity type ninth impurity diffusion region in the fourth well;

forming a second conductivity type tenth impurity diffusion region in the fourth well;

forming a gate electrode above the fourth well via an insulating film; and forming a second conductivity type eleventh impurity diffusion region in the ninth impurity diffusion region.

8. The manufacturing method of a semiconductor device according to claim 5, further comprising:

forming, in the semiconductor substrate, a second conductivity type fourth buried diffusion layer simultaneously with forming the first buried diffusion layer and the second buried diffusion layer simultaneously;

forming a second conductivity type fourth well in a fourth region of the semiconductor layer on the fourth buried diffusion layer simultaneously with forming the first well;

forming a first conductivity type ninth impurity diffusion region in the fourth well;

forming a second conductivity type tenth impurity diffusion region in the fourth well;

forming a gate electrode above the fourth well via an insulating film; and forming a second conductivity type eleventh impurity diffusion region in the ninth impurity diffusion region.

* * * * *